(12) United States Patent
Hong et al.

(10) Patent No.: US 10,290,786 B2
(45) Date of Patent: May 14, 2019

(54) TRANSPARENT LIGHT EMITTING DIODE FILM

(71) Applicant: LG ELECTRONICS INC., Seoul (KR)

(72) Inventors: Daewoon Hong, Seoul (KR); Sangtae Park, Seoul (KR); Jeongsik Choi, Seoul (KR); Dongjin Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 51 days.

(21) Appl. No.: 15/783,932

(22) Filed: Oct. 13, 2017

(65) Prior Publication Data

US 2018/0123009 A1    May 3, 2018

(30) Foreign Application Priority Data

Nov. 1, 2016  (KR) .................. 10-2016-0144453
Nov. 1, 2016  (KR) .................. 10-2016-0144455

(51) Int. Cl.
*H01L 33/62*     (2010.01)
*H01L 25/075*    (2006.01)

(52) U.S. Cl.
CPC .......... *H01L 33/62* (2013.01); *H01L 25/0753* (2013.01); *H01L 2224/16225* (2013.01); *H01L 2933/0066* (2013.01)

(58) Field of Classification Search
USPC .......................................................... 257/88
See application file for complete search history.

(56) References Cited

U.S. PATENT DOCUMENTS

| | | | |
|---|---|---|---|
| 2008/0223509 A1 | 9/2008 | Kim et al. | |
| 2014/0264398 A1* | 9/2014 | Ikeda | H01L 27/3204 257/88 |
| 2016/0079492 A1 | 3/2016 | Ishimori et al. | |
| 2016/0218259 A1* | 7/2016 | Yamada | H01L 33/56 |
| 2017/0222079 A1* | 8/2017 | Li | H01L 31/0481 |

FOREIGN PATENT DOCUMENTS

| | | |
|---|---|---|
| JP | 2011228463 | 11/2011 |
| KR | 1020140137732 | 12/2014 |
| KR | 101542411 | 8/2015 |

OTHER PUBLICATIONS

PCT International Application No. PCT/KR2017/011323, International Search Report dated Jan. 16, 2018, 3 pages.

* cited by examiner

*Primary Examiner* — Thao X Le
*Assistant Examiner* — Lawrence C Tynes, Jr.
(74) *Attorney, Agent, or Firm* — Lee, Hong, Degerman, Kang & Waimey PC

(57) ABSTRACT

A transparent light emitting diode film is disclosed. The transparent light emitting diode film includes a base, an electrode layer positioned on the base and having at least one pattern, a pad formed on at least a portion of the electrode layer, a light emitting diode positioned on the pad, and an adhesive layer formed on at least another portion of the electrode layer. The adhesive layer includes first and second adhesive layers each having a different adhesive strength.

14 Claims, 16 Drawing Sheets

TRANSPARENT LIGHT EMITTING DIODE FILM

Pursuant to 35 U.S.C. § 119(a), this application claims the benefit of earlier filing date and right of priority to Korean Patent Application Nos. 10-2016-0144453, filed on Nov. 1, 2016 and 10-2016-0144455, filed on Nov. 1, 2016, the contents of which are all hereby incorporated by reference herein in their entirety.

BACKGROUND OF THE INVENTION

Field of the Invention

The present disclosure relates to a transparent light emitting diode film.

Discussion of the Related Art

Digital signage is a communication tool that enables an advertiser to use marketing, advertisement, training, etc. and to induce customer experience. The digital signage is a digital image device that provides not only typical broadcast contents in public places such as airports, hotels, and hospitals but also advertisement contents intended by the advertisers. The digital signage includes a processor and a memory embedded therein, is freely movable, and can display clearly various contents. Thus, the digital signage can be used for a variety of purposes such as a promotional service, a customer service, and information media in department stores, subways, bus stops, etc. Further, the digital signage can provide not only advertisement contents but also various contents having other purposes than the advertisement contents.

The digital signage generally uses a plurality of light emitting diodes (LEDs). Because the LEDs have long life span and high luminous efficiency, they are replacing conventional fluorescent lamps and incandescent lamps. Further, because the LEDs have smaller size than related art light sources, they are more popular as illumination devices.

SUMMARY OF THE INVENTION

In one aspect, there is provided a transparent light emitting diode film including a base, an electrode layer positioned on the base and having at least one pattern, a pad formed on at least a portion of the electrode layer, a light emitting diode positioned on the pad, and an adhesive layer formed on at least another portion of the electrode layer, the adhesive layer including first and second adhesive layers each having a different adhesive strength.

The second adhesive layer may be positioned on the first adhesive layer.

One surface of the first adhesive layer may contact the base.

An adhesive strength of the first adhesive layer may be greater than an adhesive strength of the second adhesive layer.

The adhesive layer may include silicon.

The adhesive layer may further include a support layer between the first and second adhesive layers.

The support layer may include a polyethylene terephthalate (PET) film.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
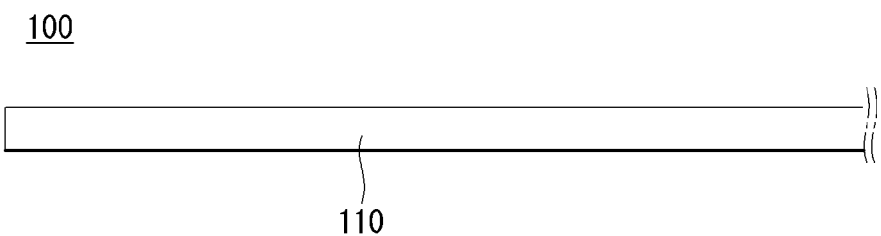
FIGS. 1 to 3 illustrate processes of forming a transparent light emitting diode film according to an embodiment of the disclosure.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Figure 2:
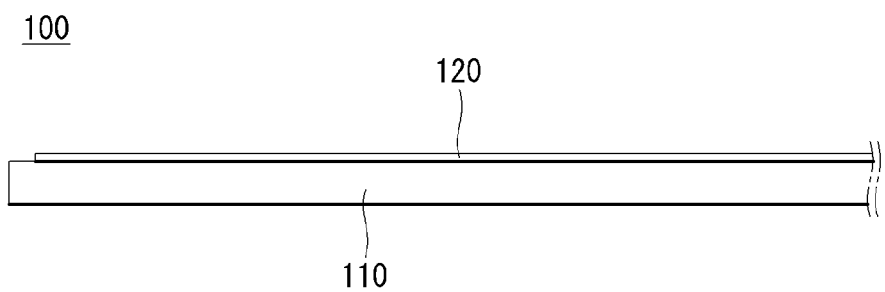
Figure 3:
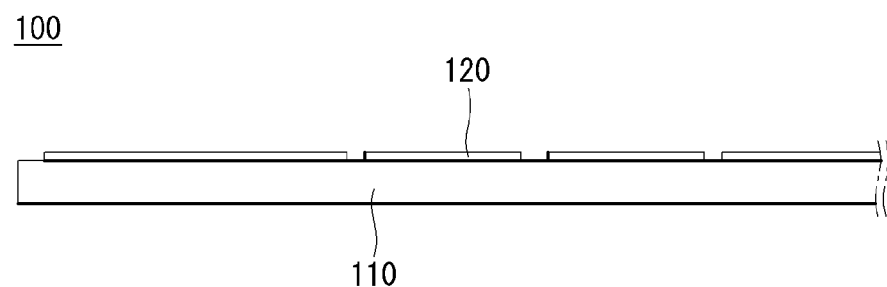

FIGS. 1 to 3 illustrate processes of forming a transparent light emitting diode film according to an embodiment of the disclosure.

As shown in FIG. 1, a transparent light emitting diode film 100 according to an embodiment of the disclosure may prepare a base 110. The base 110 may include a transparent material of a very thin thickness. For example, the thickness of the base 110 may be 250 μm.

The base 110 may include an insulating material. Hence, the base 110 can prevent electric power used to drive a light emitting diode from leaking to the outside. For example, the base 110 may include a polyethylene terephthalate (PET) film. A thermal resistance of the base 110 can be strengthened by adjusting the thickness of the base 110. The PET film having the above-described thickness may not change its state even at a temperature equal to or higher than 200° C. Hence, the base 110 can be stably maintained in a process of manufacturing the transparent light emitting diode film 100 without change in the state of the base 110.

As shown in FIG. 2, an electrode layer 120 may be formed on the base 110. The electrode layer 120 may be a portion for driving a light emitting diode on the transparent light emitting diode film 100.

The electrode layer 120 may be coated on the base 110. The electrode layer 120 may include metal nanowires. For example, the electrode layer 120 may include silver (Ag) nanowires. The Ag nanowires may have high conductivity and good transparency.

As shown in FIG. 3, the electrode layer 120 may have at least one pattern. For example, at least one pattern may be formed by irradiating a laser onto the electrode layer 120. However, embodiments are not limited thereto. For example, the electrode layer 120 may be formed using a mask process, an etching process, or other processes.

Because the electrode layer 120 has the good transparency, a formation portion of the pattern of the electrode layer 120 may not be easily visible. Hence, a user can feel that an appearance of the transparent light emitting diode film 100 is neat.

FIGS. 4 to 11 illustrate a shape of an electrode layer according to an embodiment of the disclosure.

Figure 4:
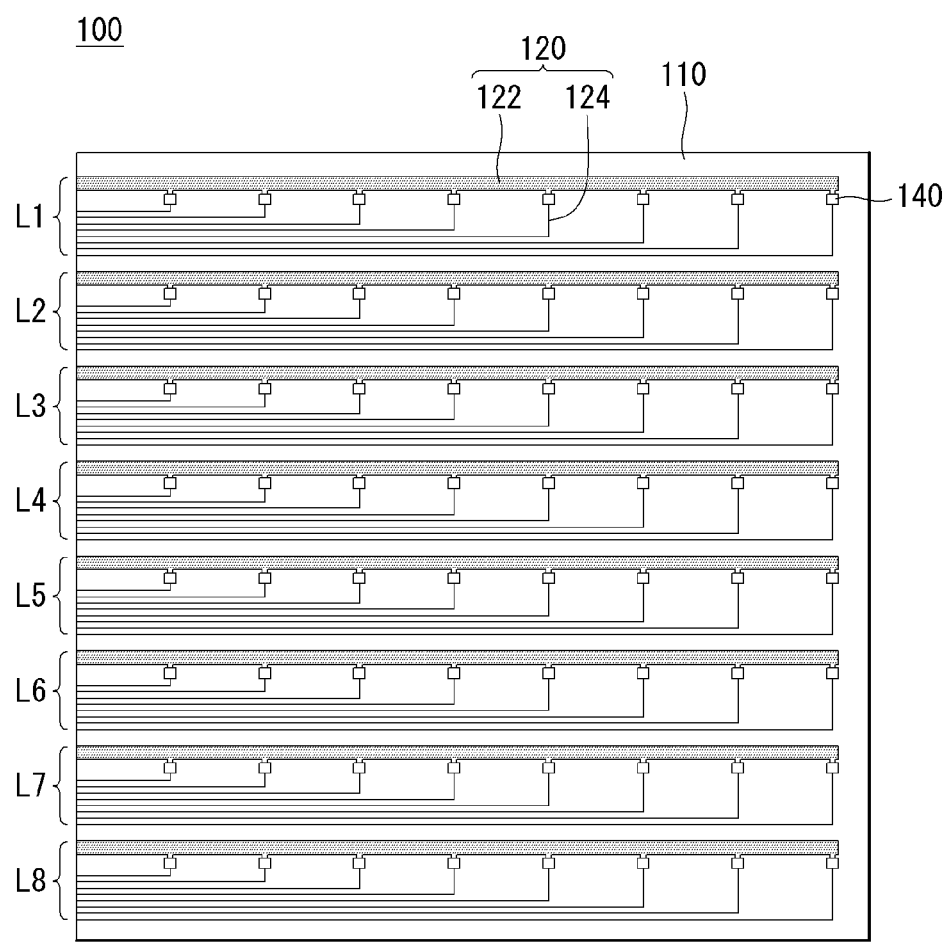
FIGS. 4 to 11 illustrate a shape of an electrode layer according to an embodiment of the disclosure.

As shown in FIG. 4, the electrode layer 120 may include a common electrode 122 and individual electrodes 124. The common electrode 122 may be extended in a first direction. The common electrode 122 may be connected to one sides of a plurality of light emitting diodes 140. The plurality of light emitting diodes 140 may be spaced apart from each other by a predetermined distance and connected to the common electrode 122. The common electrode 122 may be an anode electrode. Because the common electrode 122, which is the anode electrode, is connected to the plurality of light emitting diodes 140, a wiring resistance can be minimized by improving (or increasing) an area of the common electrode 122.

The individual electrodes 124 may be connected to the other sides of the light emitting diodes 140. The light emitting diodes 140 may be respectively connected to the individual electrodes 124. Namely, the individual electrodes 124 may be spaced apart from each other by a predetermined distance in the same manner as the light emitting diodes 140. The individual electrodes 124 may be cathode electrodes.

Each of the individual electrodes 124 can be driven and/or controlled through a constant current circuit. Namely, the light emitting diodes 140 can be individually driven and/or controlled.

The common electrodes 122 and the individual electrodes 124 may be formed on a plurality of lines L1 to L8. The plurality of lines L1 to L8 may be spaced apart from each other. Each of the plurality of lines L1 to L8 may include one common electrode 122 and the plurality of individual electrodes 124. The plurality of lines L1 to L8 can be individually driven separately from each other. Namely, the light emitting diodes 140 on the different lines may be connected to the different individual electrodes 124 and also connected to the different common electrodes 122.

Figure 5:
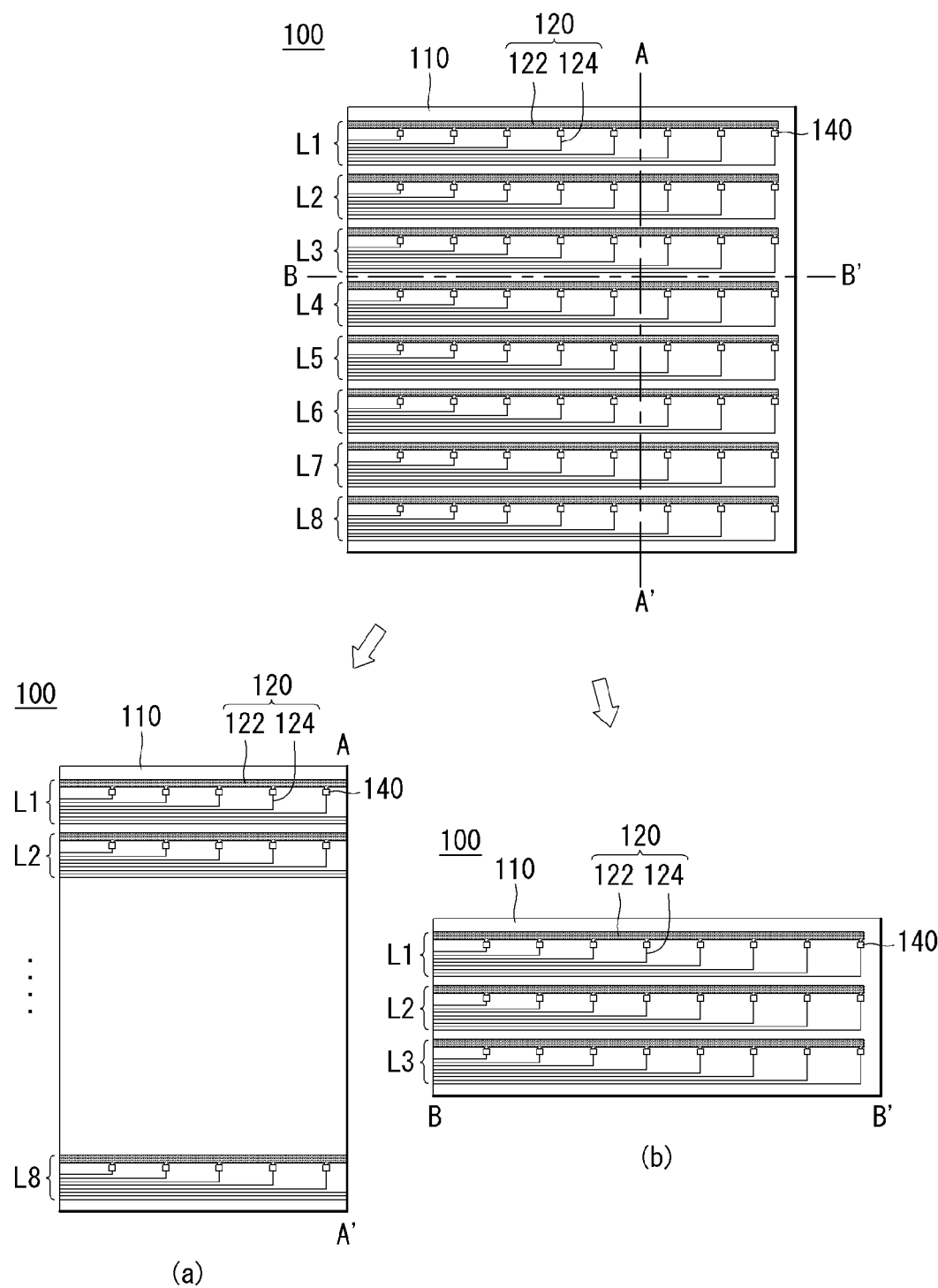

As shown in FIG. 5, the user can freely adjust the size of the transparent light emitting diode film 100. Namely, as shown in FIG. 5, when a space between at least one line of the transparent light emitting diode film 100 and another line adjacent to the at least one line is cut off, an operation and/or a control of the common electrode 122 and the individual electrode 124 connected to the light emitting diode 140 can be maintained. Namely, the common electrode 122 and the individual electrode 124 can be still operated in an area connected to an external circuit among a cut portion of the transparent light emitting diode film 100.

For example, as shown in (a) of FIG. 5, when the transparent light emitting diode film 100 is cut in a second direction, operation and/or control of the light emitting diodes 140 of the left side connected to the external circuit can be maintained. Further, because operation and/or control of the common electrode 122 and the individual electrodes 124 connected to the light emitting diodes 140 on the right side are maintained, the operation and/or the control of the light emitting diode 140 can be maintained by being connected to the external circuit.

As another example, as shown in (b) of FIG. 5, when the transparent light emitting diode film 100 is cut in the first direction, the operation and/or the control of both the light emitting diodes 140 of the upper side connected to the external circuit and the lower light emitting diodes 140 of the lower side connected to the external circuit can be maintained.

Figure 6:
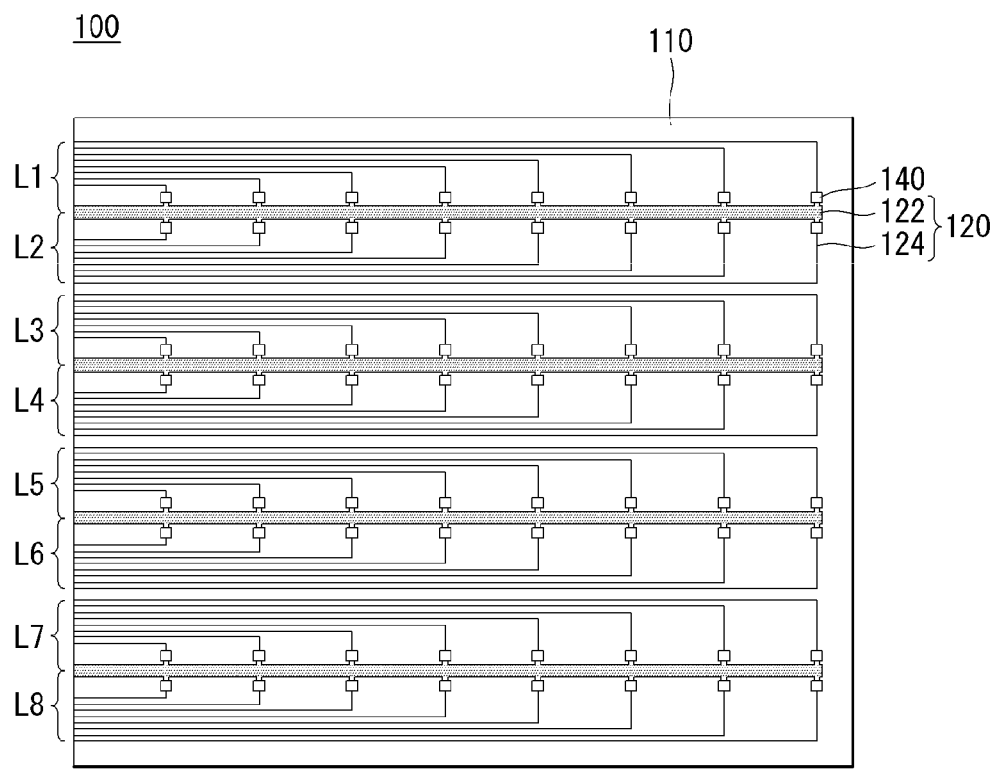

As shown in FIG. 6, the common electrode 122 may be connected to the light emitting diodes 140 on the plurality of lines L1 to L8. For example, one common electrode 122 may be simultaneously connected to the light emitting diodes 140 of the first and second lines L1 and L2. In this instance, the common electrode 122 may be positioned between the light emitting diodes 140 on the first line L1 and the light emitting diodes 140 on the second line L2. Namely, the light emitting diode 140 on at least one line may share the same common electrode 122 with the light emitting diode 140 on another line adjacent to the at least one line. In the third to eighth lines L3 to L8, the common electrode 122 may be disposed in the same manner as the first and second lines L1 and L2.

In the transparent light emitting diode film 100 according to the embodiment of the disclosure, the common electrode 122 may be connected to the light emitting diodes 140 on the plurality of lines L1 to L8. Hence, the common electrode 122 is connected to more light emitting diodes 140, and an area of the common electrode 122 may increase. Namely, a wiring resistance can be minimized due to an improvement (or an increase) in the area of the common electrode 122.

Figure 7:
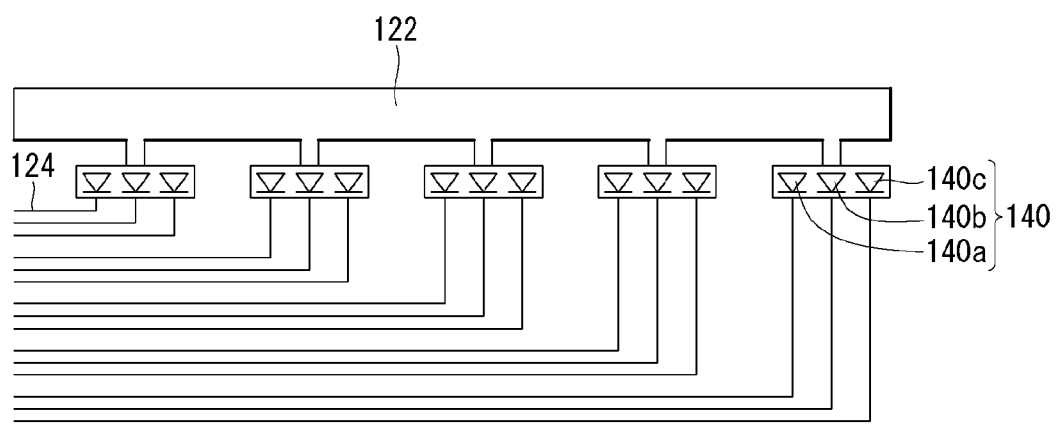

As shown in FIG. 7, the light emitting diode 140 may be a color light emitting diode (LED) package. The color LED package may include a plurality of LED chips 140a, 140b, and 140c each having a different color. For example, the light emitting diode 140 may include a red LED chip 140a, a green LED chip 140b, and a blue LED chip 140c. In this instance, the individual electrodes 124 may be respectively connected to the LED chips 140a, 140b, and 140c, so as to individually control the LED chips 140a, 140b, and 140c. Hence, even if the anode electrode is formed of the common electrode 122, it may be difficult to reduce a distance between the light emitting diodes 140.

Figure 8:
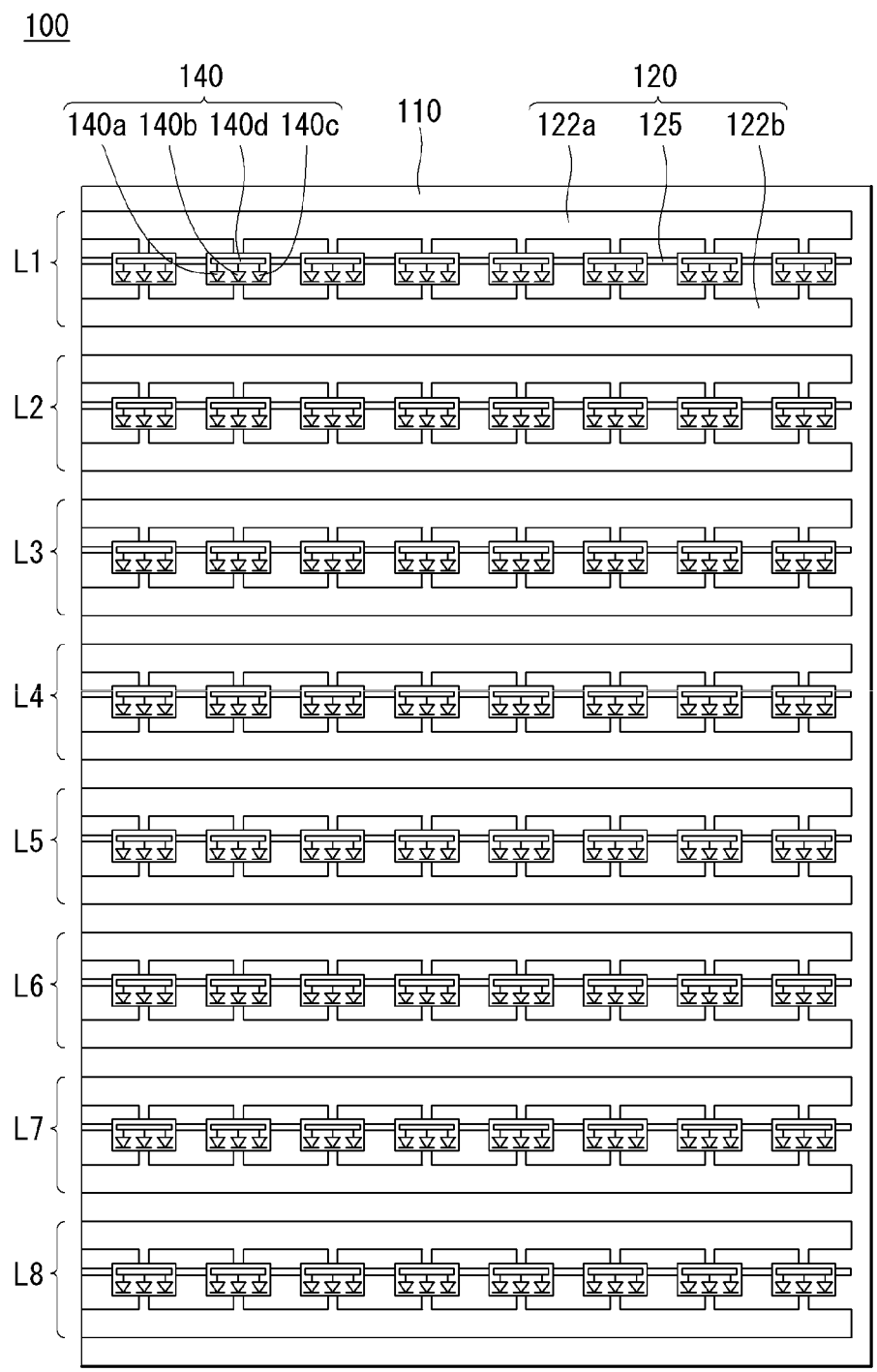

As shown in FIG. 8, the light emitting diode 140 according to the embodiment of the disclosure may further include an integrated circuit (IC) chip 140d. The IC chip 140d may drive and/or control the red, green, and blue LED chips 140a, 140b, and 140c. Namely, the light emitting diode 140 may be controlled by not the individual electrode but the IC chip 140d.

The embodiment of the disclosure may constitute a cathode electrode as well as an anode electrode using the common electrode 122. The common electrode 122 which is the anode electrode may be a first common electrode 122a, and the common electrode 122 which is the cathode electrode may be a second common electrode 122b. In this instance, the electrode layer 120 may further include a communication electrode 125 for controlling the IC chip 140d. The communication electrode 125 may be connected in series to the IC chip 140d of each light emitting diode 140.

For example, the first common electrodes 122a, the second common electrodes 122b, and the communication electrodes 125 may be formed on a plurality of lines L1 to L8. The plurality of lines L1 to L8 may be spaced apart from each other. Each of the plurality of lines L1 to L8 may include one first common electrode 122a, one second common electrode 122b, and one communication electrode 125. The plurality of lines L1 to L8 may be individually driven. Namely, the light emitting diodes 140 on the different lines may be connected to the different first common electrodes 122a, the different second common electrodes 122b, and the different communication electrodes 125.

Figure 9:
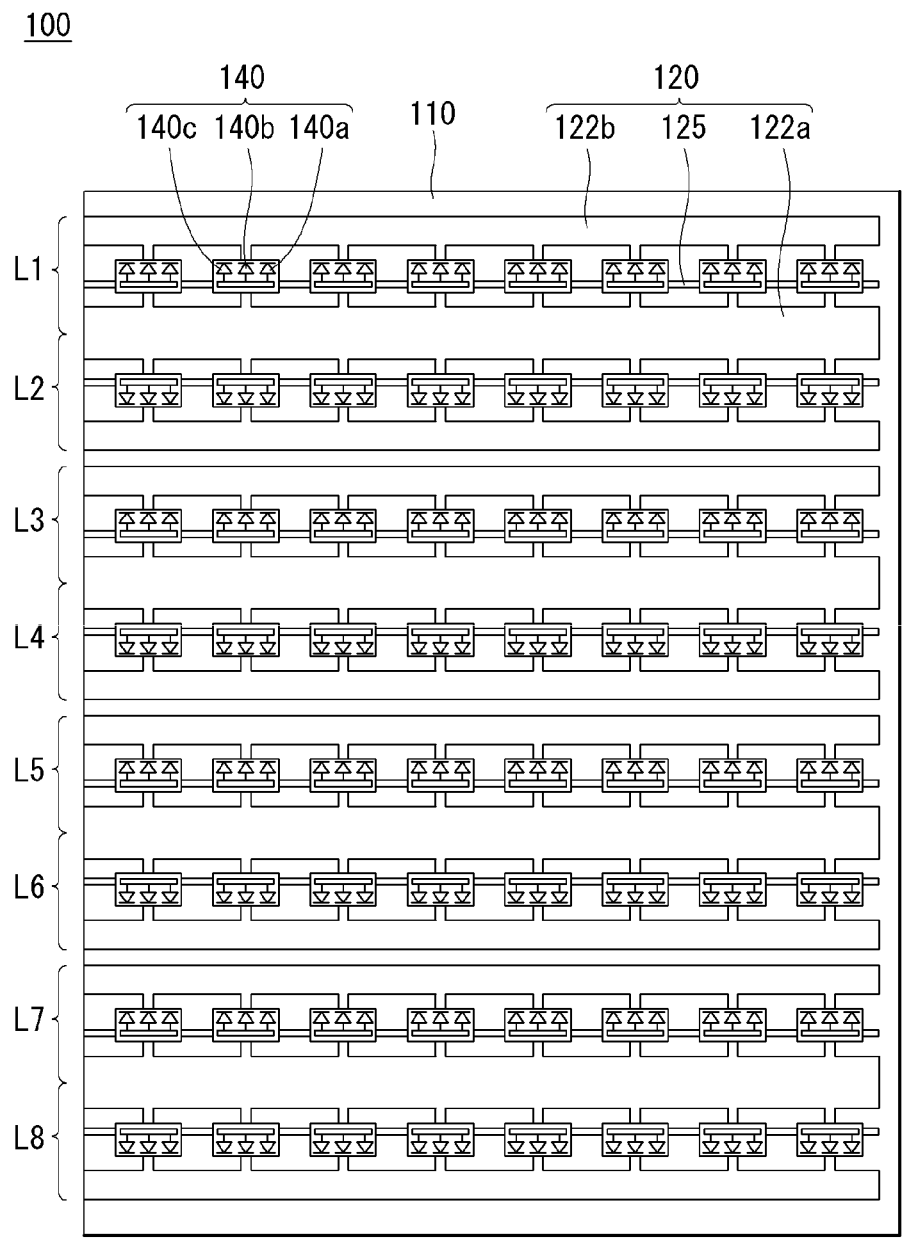

As shown in FIG. 9, the first common electrode 122a may be connected to the light emitting diodes 140 on the plurality of lines L1 to L8. For example, one first common electrode 122a may be simultaneously connected to the light emitting diodes 140 on the first and second lines L1 and L2. In this instance, the first common electrode 122a may be positioned between the light emitting diodes 140 on the first line L1 and the light emitting diodes 140 on the second line L2. Namely, the light emitting diode 140 on at least one line may share the same first common electrode 122a with the light emitting diode 140 on another line adjacent to the at least one line. In the third to eighth lines L3 to L8, the first common electrode 122a may be disposed in the same manner as the first and second lines L1 and L2. One second common electrode 122b and one communication electrode 125 may be used for each line.

In the transparent light emitting diode film 100 according to the embodiment of the disclosure, the first common electrode 122a may be connected to the light emitting diodes 140 on the plurality of lines L1 to L8. Hence, the first common electrode 122a is connected to more light emitting diodes 140, and an area of the first common electrode 122a may increase. Namely, a wiring resistance can be minimized due to an improvement (or an increase) in the area of the first common electrode 122a.

Figure 10:
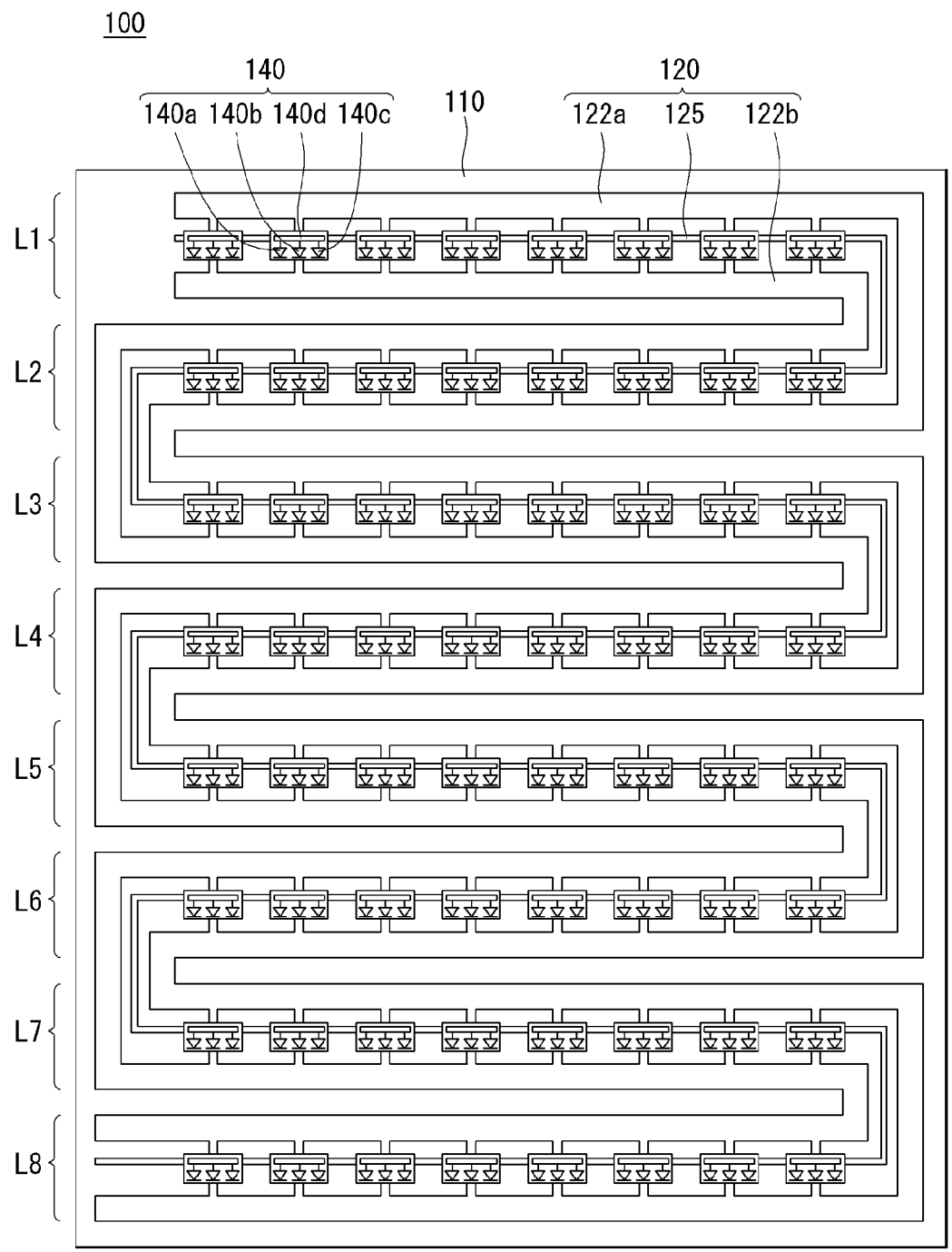

As shown in FIG. 10, the electrode layer 120 on at least one line may be connected to the electrode layer 120 on another line adjacent to the at least one line. For example, the other end of the electrode layer 120 on the first line L1 may be connected to the other end of the electrode layer 120 on the second line L2, and one end of the electrode layer 120 on the second line L2 may be connected to one end of the electrode layer 120 on the third line L3. A connection portion of the electrode layer 120 of the first line L1 and the electrode layer 120 of the second line L2 may be positioned opposite a connection portion of the electrode layer 120 of the second line L2 and the electrode layer 120 of the third line L3. Namely, the electrode layer 120 may be alternately connected to one ends and the other ends of the plurality of lines L1 to L8 to form one body. In this instance, all the light emitting diodes 140 of the transparent light emitting diode film 100 can be driven through one external circuit.

Figure 11:
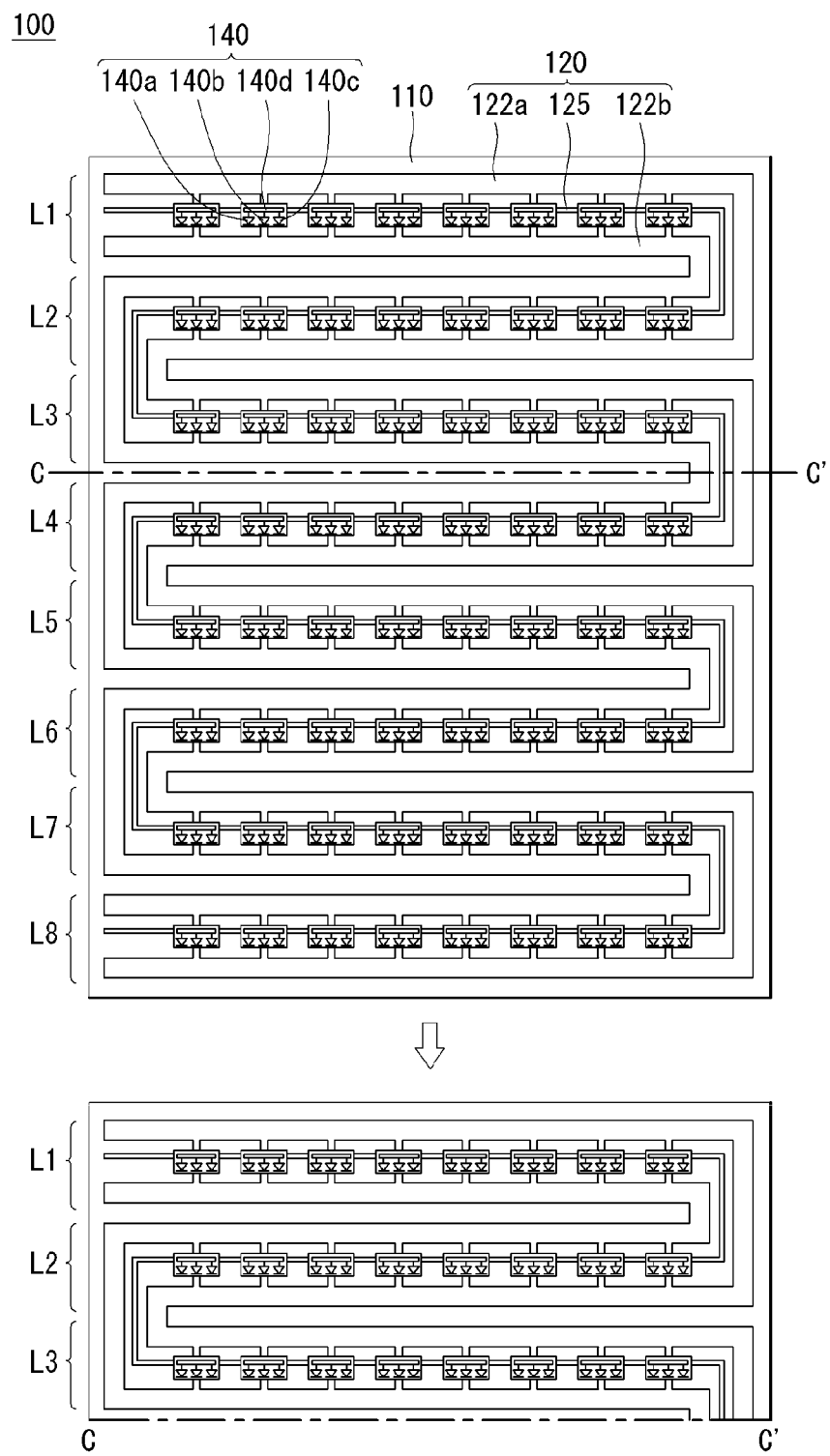

As shown in FIG. 11, the user can freely adjust the size of the transparent light emitting diode film 100. Namely, as shown in FIG. 11, when a space between at least one line of the transparent light emitting diode film 100 and another line adjacent to the at least one line is cut off, an operation and/or a control of the first and second common electrodes 122a and 122b and the communication electrode 125 connected to the light emitting diode 140 can be maintained. Namely, the first and second common electrodes 122a and 122b and the communication electrode 125 can be still operated in an area connected to the external circuit among a cut portion of the transparent light emitting diode film 100.

For example, when the transparent light emitting diode film 100 is cut in the first direction, the operation and/or the control of both the light emitting diodes 140 of the upper side connected to the external circuit and the lower light emitting diodes 140 of the lower side connected to the external circuit can be maintained.

FIGS. 12 to 15 illustrate processes of forming a transparent light emitting diode film according to an embodiment of the disclosure.

Figure 12:
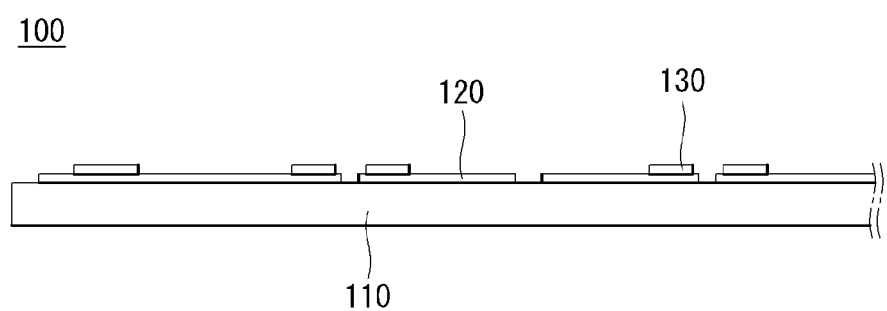
FIGS. 12 to 15 illustrate processes of forming a transparent light emitting diode film according to an embodiment of the disclosure.

As shown in FIG. 12, a pad 130 may be formed on at least a portion of an electrode layer 120. The pad 130 may include a highly conductive material. The pad 130 may be formed on a portion of the electrode layer 120 on which a light emitting diode will be disposed. The pad 130 may be a portion to which the light emitting diode is attached. For example, the pad 130 may include silver (Ag).

Figure 13:
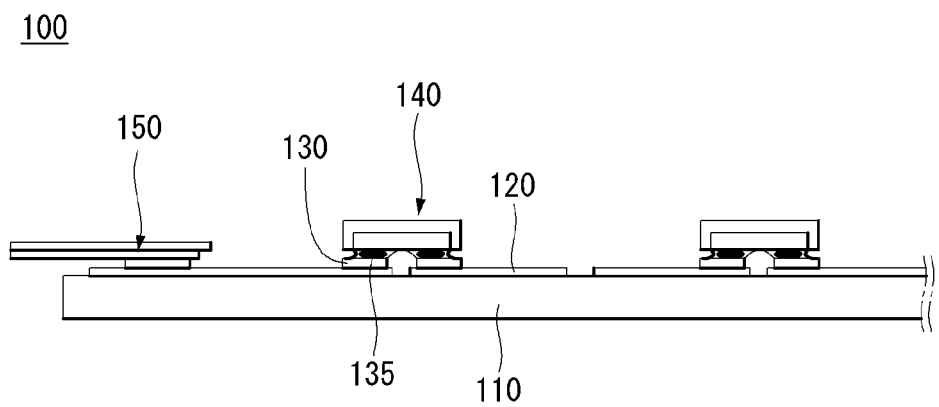

As shown in FIG. 13, a light emitting diode 140 may be fixed to the pad 130. The light emitting diode 140 may be fixed to the pad 130 using a low temperature surface mount technology (SMT) process. A plurality of light emitting diodes 140 may be positioned. At least one of the light emitting diodes 140 may be spaced apart from the other light emitting diodes 140.

A solder 135 may be printed on the pad 130. The solder 135 may help the light emitting diode 140 to be attached to the pad 130. The solder 135 may include an epoxy. The epoxy can improve a strength of the solder 135.

When a low temperature reflow process is performed to apply heat to the solder 135, the solder 135 may be hardened and fix the component. For example, the low temperature reflow process may be performed at about 160° C. for about 300 seconds. Because a base 110, the electrode layer 120, and the pad 130 have a high melting point, states of the base 110, the electrode layer 120, and the pad 130 may not change during the low temperature reflow process. In particular, because the reflow process is performed at a low temperature, the reflow process can prevent the state of the base 110 from changing.

A flexible printed circuit board (FPCB) 150 may be attached to the pad 130 positioned at one end of the transparent light emitting diode film 100. The FPCB 150 may electrically connect the electrode layer 120 to the external circuit. Hence, the FPCB 150 can assist in the driving and/or controlling the light emitting diode 140.

Figure 14:
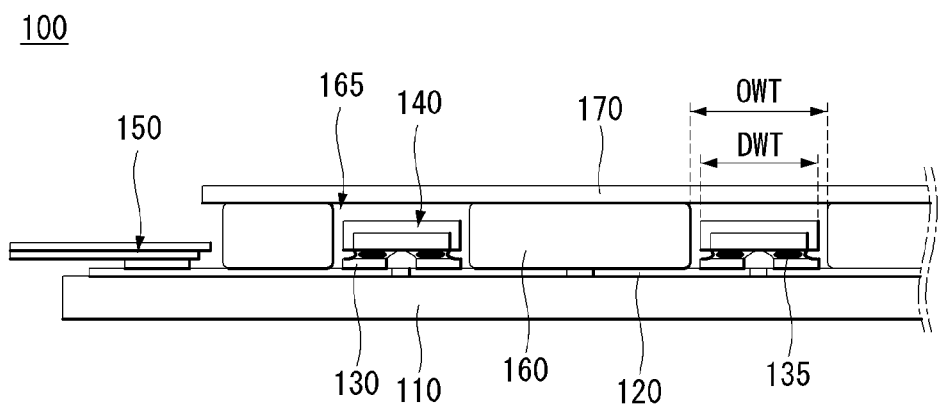

As shown in FIG. 14, an adhesive layer 160 may be positioned on at least another portion of the electrode layer 120 and may be covered with a protective layer 170. The adhesive layer 160 may include an optical clear adhesive (OCA). For example, the adhesive layer 160 may include one of silicon, acrylic, and a combination thereof. The adhesive layer 160 may have a strong coupling force between upper and lower surfaces thereof. A height of the adhesive layer 160 may be greater than a height of the light emitting diode 140. Thus, the light emitting diode 140 may not contact the adhesive layer 160. The height of the adhesive layer 160 may be, for example, 500 μm to 800 μm.

The adhesive layer 160 may be positioned at a portion excluding a formation portion of the light emitting diode 140 from the electrode layer 120. Namely, the adhesive layer 160 may have an opening 165 at a portion corresponding to the light emitting diode 140. A width OWT of the opening 165 may be greater than a width DWT of the light emitting diode 140. Namely, the adhesive layer 160 may not contact the light emitting diode 140. Thus, even if the adhesive layer 160 is attached to the electrode layer 120, an operation of the light emitting diode 140 may not be affected by the adhesive layer 160.

The protective layer 170 may be positioned on the adhesive layer 160. The protective layer 170 may be disposed on the adhesive layer 160 to prevent the adhesive layer 160 from being exposed to the outside. Hence, the protective layer 170 can preserve an adhesive strength of the adhesive layer 160.

The protective layer 170 may be spaced apart from the light emitting diode 140 by a predetermined distance not to interfere with the operation and/or the control of the light emitting diode 140. Thus, a thickness of the adhesive layer 160 may be greater than a thickness of the light emitting diode 140.

The protective layer 170 may protect the transparent light emitting diode film 100 from an external impact. Namely, even if an external force is applied to the transparent light emitting diode film 100, the light emitting diode 140 can be less impacted by the protective layer 170.

Figure 15:
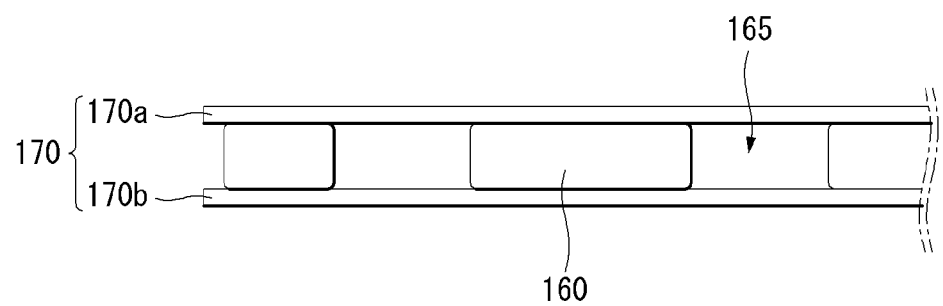

As shown in FIG. 15, the protective layer 170 may include first and second protective layers 170a and 170b. The first and second protective layers 170a and 170b may be attached to the upper and lower surfaces of the adhesive layer 160. The first and second protective layers 170a and 170b may assist in maintaining the adhesive strength of the adhesive layer 160.

The second protective layer 170b may be detached from the adhesive layer 160 before the adhesive layer 160 is coupled to the transparent light emitting diode film 100. Hence, the adhesive layer 160 in a state in which the adhesive strength is maintained can be attached to the transparent light emitting diode film 100 and can protect the light emitting diode 140.

The first protective layer 170a may be detached from the adhesive layer 160 when the transparent light emitting diode film 100 is later attached to another component. Thus, the adhesive layer 160 can assist in attaching the transparent light emitting diode film 100 to another component.

The transparent light emitting diode film 100 according to the embodiment of the disclosure may be configured such that the protective layer 170 may be positioned on both surfaces of the adhesive layer 160. Thus, the protective layer 170 can protect the adhesive layer 160 and maintain the adhesive strength of the adhesive layer 160.

Figure 16:
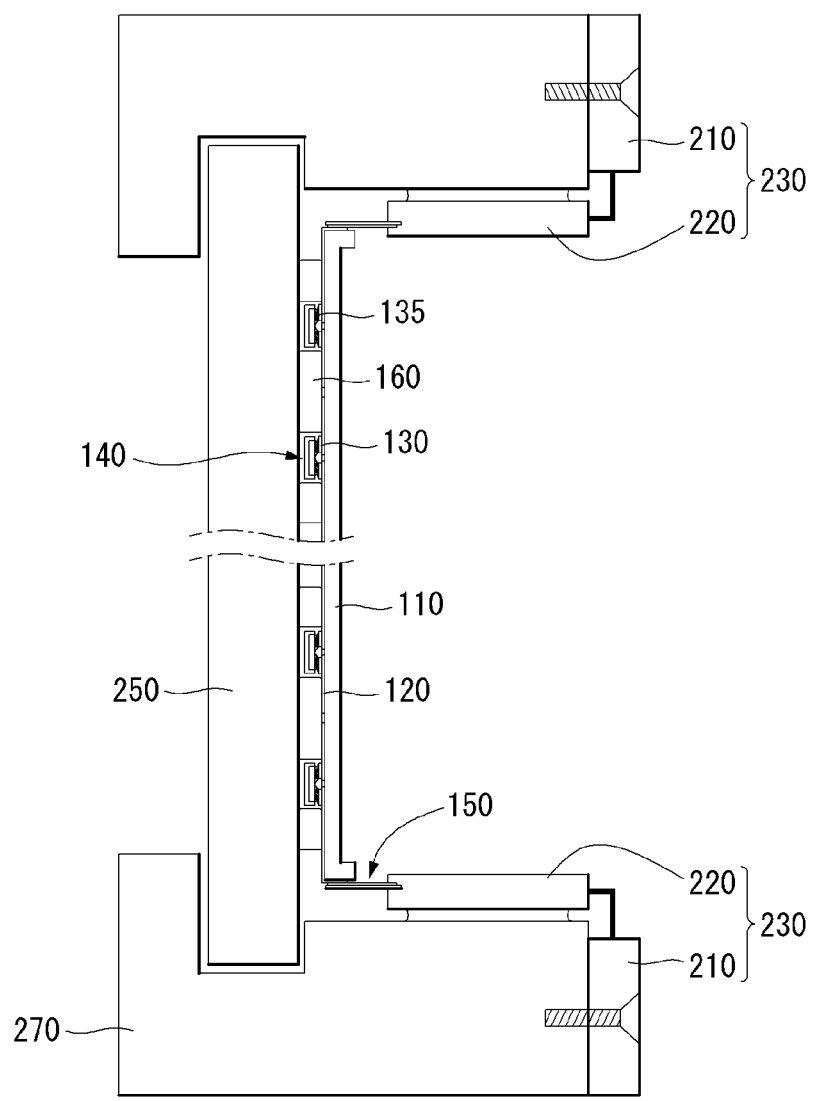
FIGS. 16 to 18 illustrate a transparent light emitting diode film according to an embodiment of the disclosure.
Figure 17:
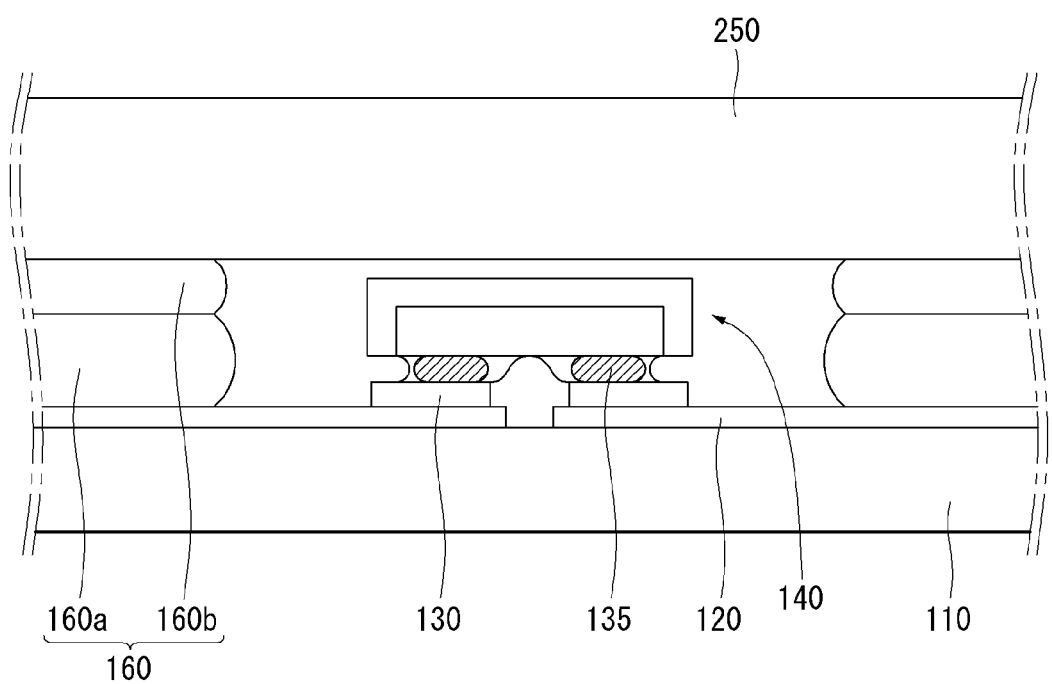
Figure 18:
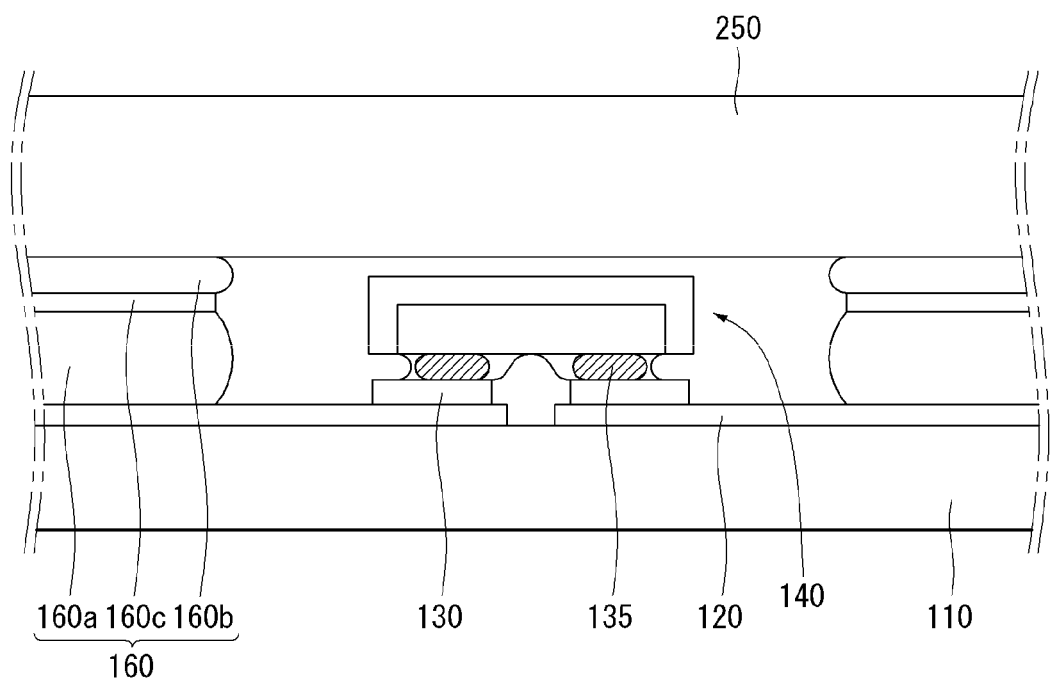

FIGS. 16 to 18 illustrate a transparent light emitting diode film according to an embodiment of the disclosure.

As shown in FIG. 16, the transparent light emitting diode film may be attached to an attachment surface 250. The above-described first protective layer 170a (see FIG. 9) may be detached from the adhesive layer, and the transparent light emitting diode film may be attached to the attachment surface 250. The attachment surface 250 may include a transparent material. The attachment surface 250 may expose light emitted from the light emitting diode 140 to the outside. The attachment surface 250 may be attached to the adhesive layer 160 of the transparent light emitting diode film. Because the thickness of the adhesive layer 160 is greater than the thickness of the light emitting diode 140, the attachment surface 250 may not contact the light emitting diode 140.

A sash 270 may be positioned at an edge portion of the attachment surface 250 to fix the attachment surface 250. The sash 270 may be configured to surround the edge portion of the attachment surface 250. The sash 270 may include a rigid material so as to fix the attachment surface 250. For example, the sash 270 may include aluminum, plastic, or metal.

At least one PCB 230 for driving and/or controlling the light emitting diode 140 may be attached to the sash 270. At least one PCB 230 may be attached to the rear of the sash 270. One end of at least one PCB 230 may be connected to the FPCB 150. Thus, at least one PCB 230 can transmit an electrical signal to the light emitting diode 140.

At least one PCB 230 may include a power board 210 and a control board 220. The power board 210 may be fixed to the sash 270. One end of the power board 210 may be connected to the control board 220. The power board 210 may supply electric power to the transparent light emitting diode film. Namely, the power board 210 may supply electric power to the light emitting diode 140. The power board 210 can change AC frequency to DC frequency. Namely, the power board 210 can change a low frequency to a high frequency, thereby increasing electrical efficiency.

The control board 220 may be fixed to the sash 270. One end of the control board 220 may be connected to the power board 210, and the other end may be connected to the FPCB 150. The control board 220 may transmit an input signal to the light emitting diode 140. Namely, the control board 220 may transmit timing signals and a video signal to the light emitting diode 140.

The transparent light emitting diode film according to the embodiment of the disclosure may be configured such that at least one PCB 230 is positioned in the rear of the sash 270. Thus, at least one PCB 230 may not be conspicuous when viewing the screen of the transparent light emitting diode film from the front.

As shown in FIG. 17, the transparent light emitting diode film according to the embodiment of the disclosure may be configured such that the adhesive layer 160 includes first and second adhesive layers 160a and 160b. The first adhesive layer 160a and the second adhesive layer 160b may be sequentially stacked.

The first adhesive layer 160a may be positioned on at least a portion of the electrode layer 120. More specifically, one surface of the first adhesive layer 160a may contact the electrode layer 120, and the other surface of the first adhesive layer 160a opposite to the one surface may contact the second adhesive layer 160b. The first adhesive layer 160a may include silicon. The first adhesive layer 160a may be thicker than the second adhesive layer 160b. The first adhesive layer 160a may have an adhesive strength greater than the second adhesive layer 160b. For example, the first adhesive layer 160a may have an adhesive strength of 0.5 kgf/25 mm to 1 kgf/25 mm. Thus, when the transparent light emitting diode film is detached from the attachment surface 250, the first adhesive layer 160a may not be separated from the electrode layer 120.

The second adhesive layer 160b may be positioned on the first adhesive layer 160a. The second adhesive layer 160b may include silicon. As described above, the adhesive strength of the second adhesive layer 160b may be less than the adhesive strength of the first adhesive layer 160a. For example, the second adhesive layer 160b may have the adhesive strength of 0.01 kgf/25 mm to 0.05 kgf/25 mm. Thus, the second adhesive layer 160b can be easily attached to or detached from the attachment surface 250.

The transparent light emitting diode film according to the embodiment of the disclosure may be configured such that the adhesive layer 160 is divided into a plurality of layers each having a different adhesive strength. Hence, the transparent light emitting diode film can be easily and quickly attached to and detached from the attachment surface 250.

As shown in FIG. 18, the adhesive layer 160 may include first and second adhesive layers 160a and 160b, and a support layer 160c. The support layer 160c may be positioned between the first and second adhesive layers 160a and 160b. Namely, the first adhesive layer 160a, the support layer 160c, and the second adhesive layer 160b may be sequentially stacked.

The support layer 160c may be positioned on the first adhesive layer 160a. The support layer 160c may function to fix the first and second adhesive layers 160a and 160b. The support layer 160c may include a polyethylene terephthalate (PET) film. The support layer 160c may fix the adhesive layer 160, so that the adhesive layer 160 is not pushed in a process of punching the adhesive layer 160. The support layer 160c may fix the first and second adhesive layers 160a and 160b, so that there is no difference in the thickness of the adhesive layer 160 even after the shape of the transparent light emitting diode film is changed.

Figure 19:
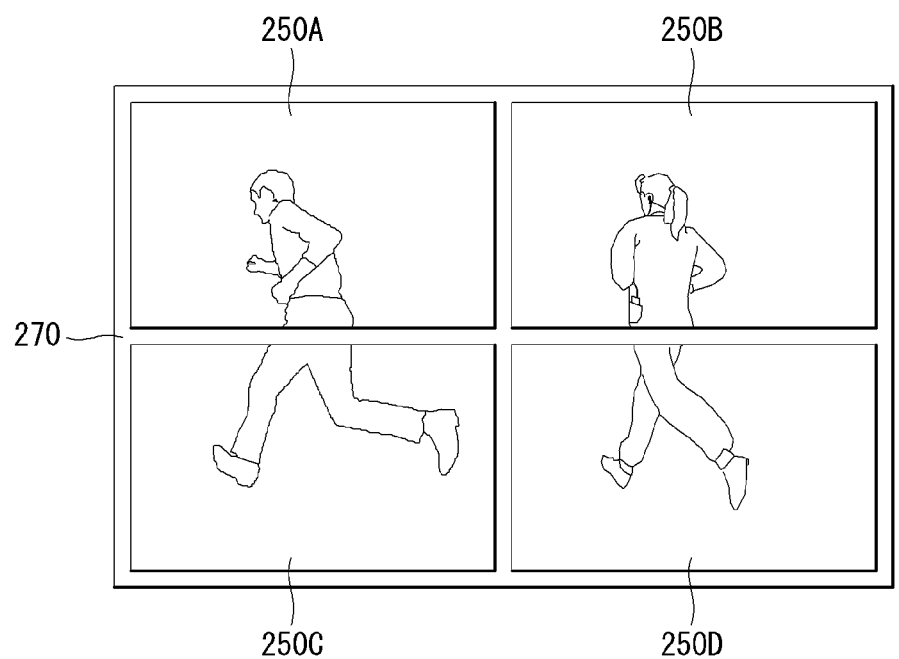
FIGS. 19 to 21 illustrate a plurality of transparent light emitting diode films according to an embodiment of the disclosure.
Figure 20:
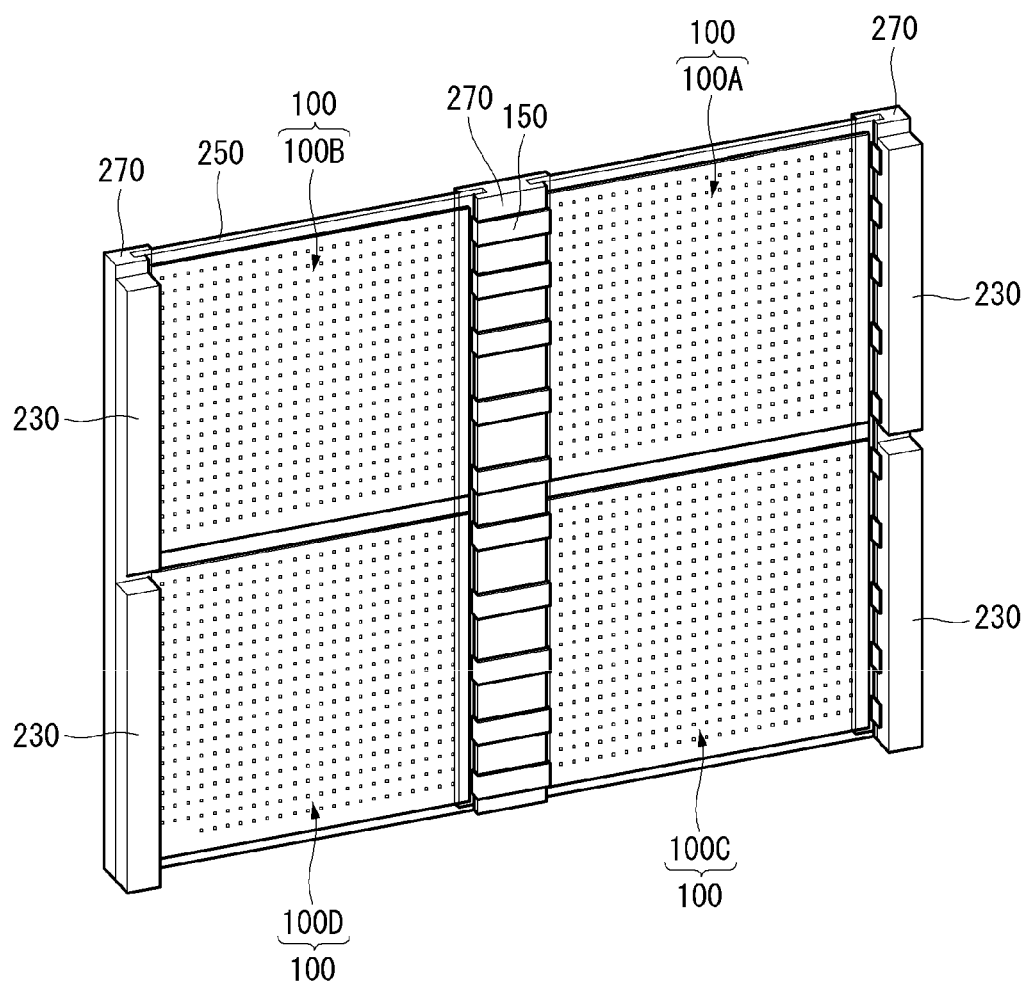
Figure 21:
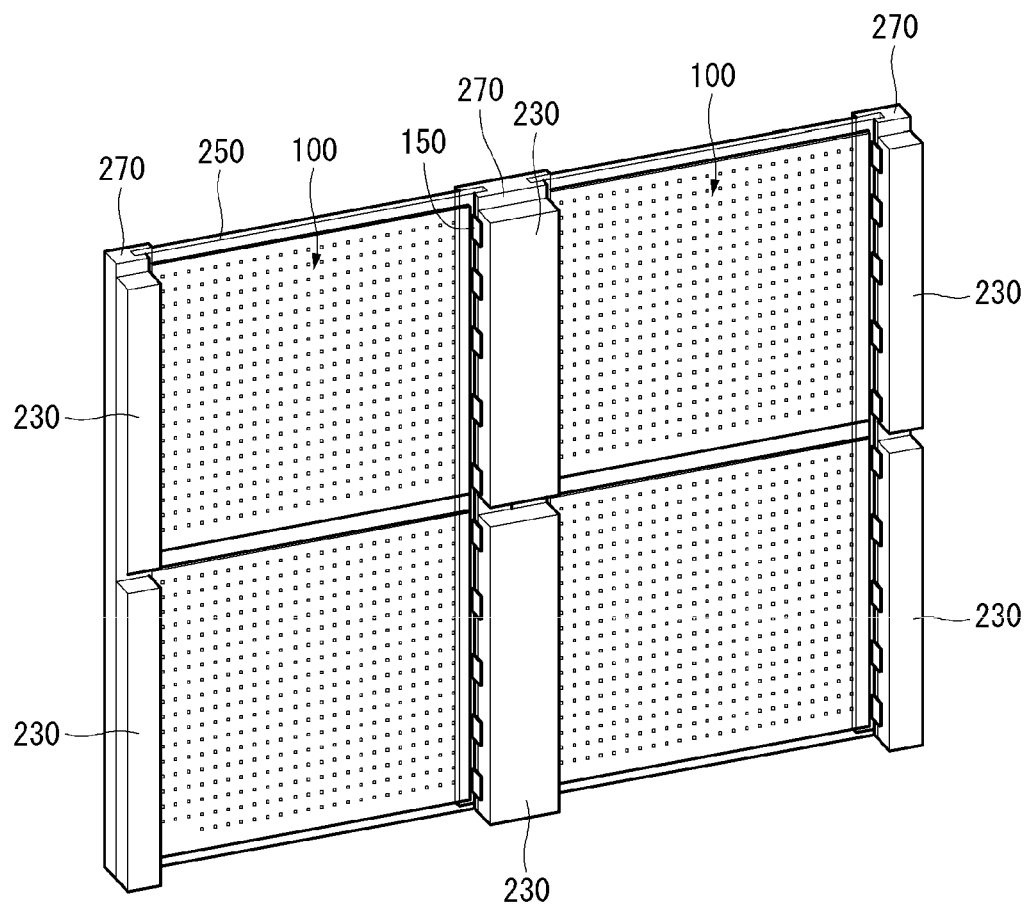

FIGS. 19 to 21 illustrate a plurality of transparent light emitting diode films according to an embodiment of the disclosure.

As shown in FIG. 19, the transparent light emitting diode film according to the embodiment of the disclosure may be attached to a plurality of attachment surfaces 250A to 250D and display one screen. Namely, one image may be divided and displayed on the plurality of attachment surfaces 250A to 250D.

A plurality of divided images may be generated by dividing an image signal in accordance with a screen division method set by at least one PCB. Thereafter, the divided images may be respectively transmitted to the corresponding transparent light emitting diode films and may be output to the screen.

In a display device according to an embodiment of the disclosure, because one screen is dividedly displayed on the plurality of transparent light emitting diode films, the very large-sized image can be displayed on the screen.

As shown in FIG. 20, one end of at least one of a plurality of transparent light emitting diode films 100 may not be connected to the PCB 230. For example, one end of a first transparent light emitting diode film 100A may be connected to the other end of a second transparent light emitting diode film 100B through the FPCB 150. Further, one end of a third transparent light emitting diode film 100C may be connected to the other end of a fourth transparent light emitting diode film 100D through the FPCB 150. At least one PCB 230 may be attached to the sashes 270 positioned at both ends of each of the transparent light emitting diode films 100A to 100D. However, the PCB 230 may not be disposed on the sash 270 positioned at the center of the screen. Hence, at least one transparent light emitting diode film (100A to 100D) may receive the image signal from at least another transparent light emitting diode film (100A to 100D) as well as at least one PCB 230.

The transparent light emitting diode 100 according to the embodiment of the disclosure may be partially disconnected from at least one PCB 230. Hence, the installation cost of the transparent light emitting diode 100 can be reduced.

As shown in FIG. 21, all both ends of each of the plurality of transparent light emitting diode films 100 may be connected to the PCB 230. Namely, the PCB 230 may be positioned on the rear surfaces of all the sashes 270. In this instance, even if one PCB 230 malfunctions, the transparent light emitting diode film 100 not connected to the malfunctioning PCB 230 can operate normally. Thus, even if one PCB 230 malfunctions, it is possible to quickly check which part of the PCB 230 malfunctions.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A transparent light emitting diode film comprising:
   a transparent base having a plate shape;
   a transparent adhesive layer formed on a front surface of the transparent base and shaped to define an opening;
   an electrode layer disposed between the base and the transparent adhesive layer;
   a pad disposed in the opening and electrically connected to the electrode layer; and
   a light emitting diode disposed in the opening and electrically connected to the pad,
   wherein the transparent adhesive layer comprises a first adhesive layer and a second adhesive layer and an adhesive strength of the first adhesive layer is different than an adhesive strength of the second adhesive layer.

2. The transparent light emitting diode film of claim 1, wherein the second adhesive layer is disposed on the first adhesive layer.

3. The transparent light emitting diode film of claim 1, wherein the first adhesive layer contacts the transparent base.

4. The transparent light emitting diode film of claim 1, wherein an adhesive strength of the first adhesive layer is greater than an adhesive strength of the second adhesive layer.

5. The transparent light emitting diode film of claim 1, wherein the transparent adhesive layer is composed of silicon.

6. The transparent light emitting diode film of claim 1, wherein the transparent adhesive layer further comprises a support layer disposed between the first and second adhesive layers.

7. The transparent light emitting diode film of claim 6, wherein the support layer is composed of a polyethylene terephthalate (PET) film.

8. The transparent light emitting diode film of claim 1, wherein the transparent adhesive layer includes a plurality of openings, and wherein one or more light emitting diodes are disposed in each of the plurality of openings.

9. The transparent light emitting diode film of claim 8, wherein a height of the transparent adhesive layer is greater than a combined height of the pad and the light emitting diode.

10. The transparent light emitting diode film of claim 8, wherein the transparent adhesive layer is configured to be attached to an attachment surface of a display such that the one or more light emitting diodes do not contact the attachment surface.

11. The transparent light emitting diode film of claim 1, wherein the first adhesive layer is disposed between the second adhesive layer and the electrode layer.

12. The transparent light emitting diode film of claim 11, wherein a support layer is further disposed between the second adhesive layer and the electrode layer.

13. The transparent light emitting diode film of claim 12, wherein the support layer is disposed between the second adhesive layer and the first adhesive layer.

14. The transparent light emitting diode film of claim 1, wherein a thickness of the first adhesive layer is greater than a thickness of the second adhesive layer.

* * * * *